United States Patent [19]

Nicholls

[11] Patent Number: 4,539,657

[45] Date of Patent: Sep. 3, 1985

[54] MEMORY SYSTEM

[75] Inventor: Robin P. Nicholls, Santa Barbara, Calif.

[73] Assignee: Raytheon Company, Lexington, Mass.

[21] Appl. No.: 529,319

[22] Filed: Sep. 6, 1983

[51] Int. Cl.³ .............................................. G11C 27/00
[52] U.S. Cl. ....................................... 365/45; 365/189
[58] Field of Search ................... 365/45, 46, 189, 230, 365/233

[56] References Cited

U.S. PATENT DOCUMENTS 4,223,404 9/1980 Lowenschuss .
4,380,816 4/1983 Nicholls .
4,399,518 8/1983 Bardl ..................................... 365/45

*Primary Examiner*—Terrell W. Fears
*Attorney, Agent, or Firm*—Richard M. Sharkansky; Joseph D. Pannone

[57] ABSTRACT

Apparatus for storing a periodic signal and for recycling complete cycle portions of such stored periodic signal is provided, such apparatus comprising: means for converting an input sinusoidal signal into a corresponding first train of pulses; means for producing a second train of pulses representative of samples of the input sinusoidal signal; means for producing a signal related to the difference in time between the leading edge of the first train of pulses and the leading edge of the second train of pulses to provide a control signal related to a time interval between a first time such time difference is less than a predetermined value and a second later time such time difference is less than such predetermined value; storage means; and means, responsive to the control signals for recycling complete cycles of the first train of pulses through the storage means.

4 Claims, 13 Drawing Figures

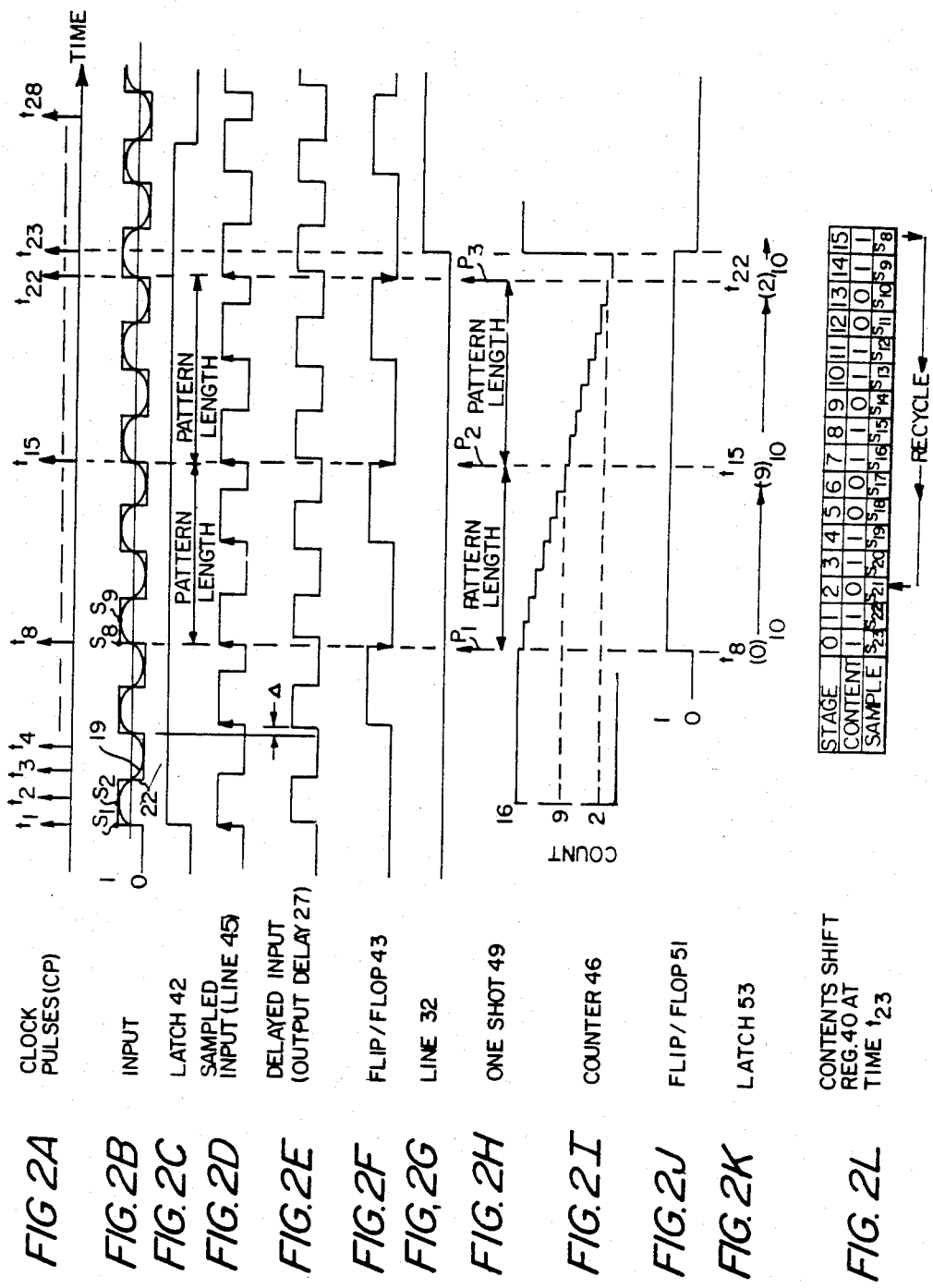

MEMORY SYSTEM

BACKGROUND OF THE INVENTION

This invention relates generally to memory systems and more particularly to memory systems which are adapted to store a periodic signal and recycle complete cycles of such stored periodic signal.

As is known in the art, it is sometimes desirable to receive a pulse of radio frequency energy and produce a continuous wave signal having a frequency related to the frequency of the received energy. Such continuous wave signal may, for eample, be transmitted as either a continuous wave signal or may be pulse modulated to enable transmission of a train of radio frequency signals. One technique suggested to produce such continuous wave signal has been to store the receive signal in a re-circulating memory; however, because the phase of the receive signal at the start of the pulse relative to the phase of the signal at the end of the pulse is generally not known, because the frequency of the signal is not known, a phase discontinuity may be produced during the recycling. This phase discontinuity distorts the continuous wave signal being produced and thereby reduces the effectiveness of the system. In another technique, this phase discontinuity problem is solved by producing control signals indicating the start of each cycle of the receive signal. Such technique is described in U.S. Pat. No. 4,223,404 "Apparatus for Recycling Complete Cycles of a Stored Periodic Signal" issued Sept. 16, 1982, to Oscar Lowenschuss and assigned to the same assignee as the present invention. Such system stores a slice of, or the complete radio frequency pulse, and then recycles complete cycles of the store signal. While such system is useful in many applications, in other applications it is desirable to recycle complete cycles of the received pulse prior to the termination of an arbitrary pulse slice thereof or the received signal itself.

Another system is described in my U.S. Pat. No. 4,380,816 issued Apr. 19, 1983 and assigned to the same assignee as the present invention. In this system, samples of a periodic signal are stored in the memory at a time commencing at the start of a cycle of the periodic signal. A first control signal is produced at the start of each cycle of the periodic signal and a second control signal is produced when a predetermined portion of the storage means is full. In response to the second control signal and one of the first control signals produced after the second control signal, a signal is produced indicating the portion of the memory having samples of complete cycles of the periodic signal stored therein, such indicating signal being related to the amount of samples stored in the predetermined portion of the memory plus the amount of samples stored in such memory between the time of the second control signal and the time of the first one of the first control signals produced after the second control signal. The samples in the portion of the memory having complete cycles stored therein as indicated by the indictating signal, are then recycled through the memory. While such apparatus is useful in many applications, in other applications a higher degree of accuracy is required in replicating the frequency of the periodic signal.

SUMMARY OF THE INVENTION

In accordance with the present invention, apparatus for storing a periodic signal and for recycling complete cycle portions of such stored periodic signal is provided, such apparatus comprising: means for converting an input sinusoidal signal into a corresponding first train of pulses; means for producing a second train of pulses representative of samples of the input sinusoidal signal; means for producing a signal related to the difference in time between the leading edge of the first train of pulses and the leading edge of the second train of pulses to provide a control signal related to a time interval between a first time such time difference is less than a predetermined value and a second later time such time difference is less than such predetermined value; storage means; and means, responsive to the control signal, for recycling complete cycles of the first train of pulses through the storage means.

BRIEF DESCRIPTION OF THE DRAWINGS

The foregoing features of this invention, as well as the invention itself, may be more fully understood from the following detailed description read together with the accompanying drawings, in which:

FIGS. 2A–2L are diagrams useful in understanding the invention.

DESCRIPTION OF THE PREFERRED EMBODIMENT

Figure 1:
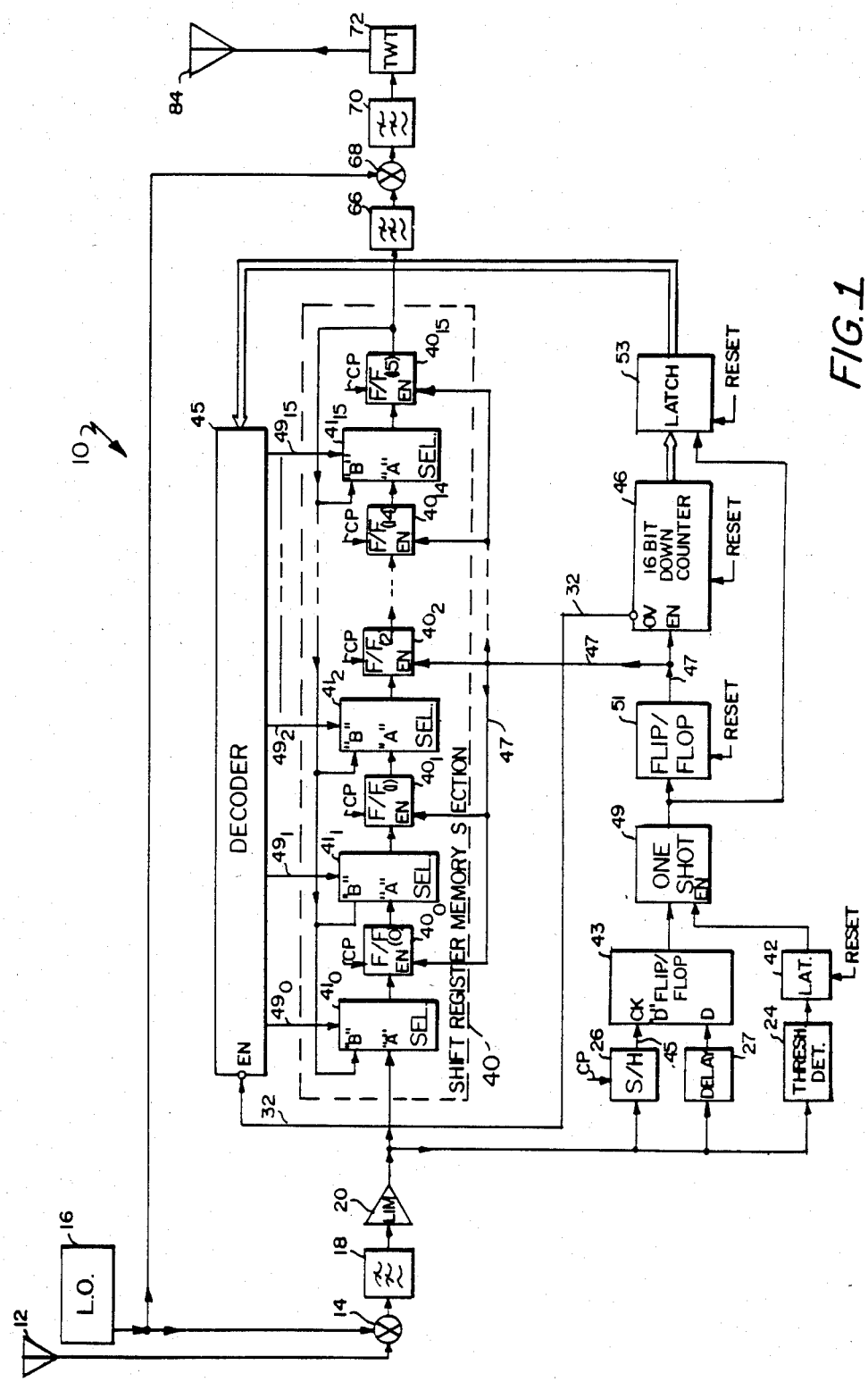
FIG. 1 is a block diagram of a memory system according to the invention.

Referring now to FIG. 1, a memory system 10 adapted to receive pulses of radio frequency energy and transmit a continuous wave radio frequency signal having a frequency related to the frequency of the received radio frequency energy is shown. Such system 10 includes a conventional radio frequency antenna 12 coupled to a mixer 14, as shown. Also fed to such mixer 14 is a local oscillator signal produced by conventional local oscillator 16. The mixer heterodynes the local oscillator signal with the received radio frequency signal to translate the frequency of the received signal to a suitable intermediate frequency signal. Here, for example, the intermediate frequency is within the bandwidth 0 to 5 megahertz. A low pass filter 18 is coupled to the output of mixer 14 to reject harmonics having frequencies greater than 5 megahertz (MHz) which are produced by the heterodyning process described. Thus, the output of the low pass filter 18 is an intermediate frequency signal having a frequency within a bandwidth 0 to 5 megahertz.

The output of filter 18 is shown in FIG. 2B as a sinusoidal signal 19. The sinusoidal signal is fed to a limiter 20 which converts the sinusoidal signal to a train of pulses 22 (FIG. 2B) having a "high" or logical 1 state when the sinusoidal signal 19 is of a positive polarity and a "low" or logical 0 state when the sinusoidal signal 19 has a negative polarity, as indicated. The train of pulses 22 produced by limiter 20 is fed to a threshold detector 24, a sample hold network 26, a delay network 27, and a shift register memory section 40, as shown.

Shift register memory section 40 includes a plurality of, here 16, storage stages, here flip/flops $40_0$–$40_{15}$ and a plurality of selectors $41_0$–$41_{15}$. Each one of the selectors has a pair of inputs "A" and "B" and an output which is coupled to a corresponding one of the flip/flops, as shown. Thus, the outputs of selectors $41_0$–$41_{15}$ are coupled to flip/flops $40_0$–$40_{15}$, respectively, as shown. It is noted that the output of limiter 20 is coupled to the "A" terminal of selector $40_0$. However, the outputs of flip/- flops $40_0$–$40_{14}$ are coupled to the "A" inputs of selectors $41_1$–$41_{15}$, respectively, as indicated. The output of flip/flop $40_{15}$ is coupled to all of the "B" terminals of selectors $41_0$–$41_{15}$, as shown. A selected one of "A" or "B" inputs of the selectors $41_0$–$41_{15}$ is coupled to the output of such selector in accordance with a binary signal fed to such selector from decoder 45. It is noted that decoder 45 also has an enable terminal (EN). When the signal fed to the enable terminal on line 32 is "low," or logical 0, the outputs produced by the decoder 45 on lines $49_0$–$49_{15}$ for each one of the selectors $41_0$–$41_{15}$, respectively, is logical 0 and in response to such logical 0 signal the "A" terminal of the selectors $41_0$–$41_{15}$ are coupled to the output of such selectors. Each one of the flip/flops $40_0$–$40_{15}$ has an enable terminal (EN) and such enable terminals are coupled together via line 47, as shown. Therefore, when the signal on line 47 is "high" or logical 1, the flip/flops $40_0$–$40_{15}$ are enabled and the binary data fed thereto from the selecter coupled thereto is strobbed and stored into such flip/flops in response to clock pulses fed thereto on line CP. Thus, when enabled shift register memory section 40 may be considered as comprising a plurality of, here 16 successively coupled storage stages stages 0 to 15 represented flip/flops $40_0$–$40_{15}$, respectively, as indicated. Further, when the decoder 45 is not enabled, that is when the signal on line 32 is logical 0, the output of limiter 20 (i.e. the input signal 22 in FIG. 2B) is fed to flip/flop $40_0$ and the outputs of the flip/flops $40_1$–$40_{15}$ are serially coupled together through the "A" terminals of the selector $41_0$–$41_{15}$ preceeding such flip/flops $40_0$–$40_{15}$. To put it another way, when decoder 45 is not enabled, memory section 40 is configured as a conventional 16 stage shift register, the input of which is coupled to the output of limiter 20.

Threshold detector 24, in response to the detection of the received radio frequency signal, produce a "high" or logical 1 signal which is latched into latch 42, as shown in FIG. 2C. In response to clock pulses CP produced at a regular rate, here at a rate slightly greater than 10 MHZ, as shown in FIG. 2A by a conventional clock (not shown), samples of the pulse train 22 are produced by sample-hold network 26, as shown in FIG. 2D. The sampled pulses are fed to the "clock" (CK) terminal of a "D" type flip/flop 43, as shown. The train of pulses 22 produced by limiter 20 is fed through delay 27 to the "D" terminal of "D" flip/flop 43, as shown. The delay provided by delay network 27 is a fraction of a clock pulse period, and, is provided to allow time for the flip/flop 43 to set up for clocking by samples produced by sample hold network 26 on line 45. The output of flip/flop 43 is initially reset to a logical 1 state and hence, the output of flip/flop 43 stores, in response to the leading edge of the pulses produced on line 45 (FIG. 2D) the logical state of the delay pulsed train (FIG. 2F) at the time of such leading edge. Hence, the leading edge occurs when the sampled input (FIG. 2D) on line 45 changes from a logical 0 state to a logical 1 state.

The pulses produced at the output of flip/flop 43 (FIG. 2F) are fed to a one shot multi-vibrator 49. Also fed to the one shot multi-vibrator 49 is a signal produced at the output of latch 42 (FIG. 2C). The output of one shot multi-vibrator 49 thus produces a short pulse ($P_1$, $P_2$, $P_3$) in response to each one of the trailing edges of the pulses produced at the output of flip/flop 43, as shown in FIG. 2H. The output of one shot multi-vibrator 49 is fed to a flip/flop 51 and to a latch 53, as shown. Flip/flop 51 has its output coupled, via line 47, to the enable (EN) terminal of a 16 bit down-counter 46 and to the enable (EN) terminal of flip/flops $40_0$–$40_{15}$, as shown. It is noted that the output of flip/flop 51 is initially reset to a "low" or logical 0 state, as shown in FIG. 2J. In response to the first pulse $P_1$ (FIG. 2H) produced by one shot multi-vibrator 49, the output of flip/flop 51 goes "high" (FIG. 2J) to enable 16 bit counter 46 to count down in response to clock pulses fed thereto on line CP, as shown in FIG. 2I. In response to each pulse ($P_1$, $P_2$, $P_3$) produced by one shot multi-vibrator 49, the contents of counter 46 become stored in initially reset latch 53, as shown in FIG. 2K. When counter 46 counts 16 bits, the overflow output (OV) thereof goes "high" thereby changing the "low" signal on line 32 to a "high" signal, as shown in FIG. 2G, to thereby allow decoder 45 to produce logical 1 or 0 signals on output terminals $49_0$–$49_{15}$ thereof selectively in accordance with the contents of latch 53, in a manner to be described hereinafter. Thus, when the counter 46 reaches a count of zero, the contents stored in latch 53 serves to selectively couple the output of flip/flop $40_{15}$ (that is the output in the last stage of the 16 stages of the shift register memory section 40) to an input of a selected one of the previous stages of such shift register memory section 40. More particularly, the output of flip/flop $40_{15}$ is coupled to the input of one of the flip-flop $40_0$–$40_{15}$ via the "B" terminal of one of the selectors $41_0$–$41_{15}$ selected by decoder 45 preceeding such flip/flop to thereby enable the output pulses produced by flip/flop $40_{15}$ to couple into one of the preceeding flip/flop's in a manner to be described hereinafter.

Considering the example illustrated in FIGS. 2A–2L, it is noted that the pulses $P_1$, $P_2$, $P_3$ are produced by one shot multi-vibrator 49 (FIG. 2H), each time the leading edge of the sampled input on line 45 (FIG. 2D) is time coincident with the leading edge of the pulses in input pulse train 22 (FIG. 2B). It is noted that because of delay 27 there is a predetermined time difference $\Delta$ between the time of the leading edge of the sampled input on line 45 (FIG. 2D) and the time of the leading edge of the delayed input (FIG. 2E). Hence, each time the leading edge of the sampled input on line 45 (FIG. 2D) is within a time difference $\Delta$ of the leading edge of the input pulse train, pulses are produced by one shot multi-vibrator 49 (FIG. 2H). It is noted that the pulses in the sampled pulse train (FIG. 2D) repeat in a "pattern length" time interval (i.e. the time interval between the pulses $P_1$, $P_2$, $P_3$ produced by one shot multi-vibrator 49 (FIG. 2H)). Thus, considering FIGS. 2A–2L, it is noted that pulses $P_1$, $P_2$, $P_3$ are produced at times $t_8$, $t_{15}$ and $t_{22}$, respectively. Thus, samples $S_8$–$S_{14}$ and $S_{15}$–$S_{21}$ provide two identical pulse trains as shown in FIG. 2L. In response to the first pulse $P_1$ produced by one shot multi-vibrator 49, flip/flop 51 produces a logical 1 output enabling counter 46 and flip/flop $40_1$–$40_{15}$ with the result that decoder 45 produces logical 0 signals on all of the outputs $49_0$–$49_{15}$ thereof with the result that the "A" input terminals of the selectors $41_0$–$41_{15}$ are coupled to the input of the flip/flops $40_0$–$40_{15}$, respectively, as described above. Thus, the contents of counter 46 decrements in response to each one of the clock pulses CP, as shown in FIG. 2I. Thus in response to each clock pulse beginning at time $t_8$, a sample of the input signal 22 is taken and said sample is stored in the first stage (0) of the shift register memory section 40 with prior samples in such shift register section 40 being shifted sequentially through the sequentially coupled stages thereof. Thus, the time of the 23rd clock pulse ($t_{23}$) flip/flops $40_{15}$–$40_0$ have stored therein samples $S_8$–$S_{23}$, as indicated in FIG. 2L. The contents stored in latch 53 at the time the counter 46 decrements to $(0)_{10}$ causes decoder 45 to couple the output of flip/flop $40_{15}$ to one of the preceeding flip/flop's as follows:

| Contents of latch 53 | Output of flip/flop $40_{15}$ is coupled to input of flip/flop: |
|---|---|
| $(0)_{10}$ | $40_0$ |
| $(1)_{10}$ | $40_1$ |
| $(2)_{10}$ | $40_2$ |
| $(3)_{10}$ | $40_3$ |
| ″ | ″ |
| ″ | ″ |
| $(15)_{10}$ | $40_{15}$ |

Thus, since at the time of the 23rd clock pulse the contents stored in latch 53 is $(2)_{10}$, such contents stored in latch 53 become decoded by decoder 45 and in response thereto, the output line $49_2$ goes to a logical 1 state while lines $49_0$–$49_1$ and $49_3$–$49_{15}$ remain low so that the output of flip/flop $40_{15}$ is coupled to the input of flip/flop $40_2$. In this way, samples $S_8$–$S_{21}$ recycle through the shift register memory section 40, as indicated in FIG. 2L. Thus, it is noted that the contents latched into latch 53 indicates the storage stage which is to be fed by the output of stage 15. It follows than that in response to succeeding pulses on line CP, samples in the last fourteen stages, stages 2 to 15 of the shift register memory section 40 recycle through such memory section 40.

The output of the last stage, that is flip/flop $40_{15}$ which thus sequentially produced are fed to low pass filter 66 to filter harmonics of the binary signals passing there-through from flip/flop 45. The fundamental frequency of such binary signal will be the frequency of the intermediate frequency signal passing through low pass filter 66. The output of low pass filter 66 is fed to a mixer 68 where it is heterodyned with a local oscillator signal produced by the local oscillator 16 to up-convert the frequency of such signal to a continuous wave signal having the frequency of the received radio frequency signal. The output of mixer 68, after passing through a low pass filter 70 to remove higher order harmonics, is amplified in a conventional radio frequency amplifier, here a traveling wave tube (TWT) amplifier 82, and is transmitted via antenna 84. After a desired number of samples of the continuous wave signals have been transmitted, the recycling of the shift register memory section 40 is reset by resetting latch 42, flip/flop 43, latch 53 and counter 46 by any conventional means, as by an operator.

Having described a preferred embodiment of this invention, it is now evident that other embodiments incorporating these concepts may now be used. For example, while a shift register has been used for storage, a random access memory may have been used such as the type described in U.S. Pat. No. 4,318,183 "Multiple Channel Digital Memory System" issued Mar. 2, 1982 to inventors Ray E. Byington and William M. Pease and assigned to the same assignee as the present invention. It is felt, therefore, that this invention should not be restricted to the disclosed embodiment but rather should be limited only by the spirit and scope of the appended claims.

What is claimed is:

1. Apparatus for storing a periodic signal and for recycling complete cycle portions of such stored periodic signal is provided, such apparatus comprising:
   means for converting an input sinusoidal signal into a corresponding first train of pulses;
   means for producing a second train of pulses representative of samples of the input sinusoidal signal;
   means for producing a signal related to the difference in time between the leading edge of the first train of pulses and the leading edge of the second train of pulses to provide a control signal related to a time interval between a first time such time difference is less than a predetermined value and a second later time such time difference is less than such predetermined value;
   storage means; and
   means, responsive to the control signal, for recycling complete cycles of the first train of pulses through the storage means.

2. Apparatus for storing a periodic signal and for recycling complete cycle portions of such stored periodic signal is provided, such apparatus comprising:
   (a) means for converting a received periodic signal into a corresponding first train of pulses;
   (b) means for producing a second train of pulses representative of periodic samples of the periodic signal;
   (c) storage means;
   (d) means for coupling the first train of pulses to the storage means for storage therein during a first period of time;
   (e) means for producing a control signal related to the difference in time coincidence between the first and second trains of pulses; and
   (f) means responsive to the control signal, for recycling through the storage means during a second period of time complete cycles of a portion of the first train of pulses stored in the storage means.

3. The apparatus recited in claim 2 wherein the recycling means includes means, responsive to the control signal, for producing a signal representative of the portion of the first train of pulses stored in the storage means during the first time period having a complete cycle.

4. Apparatus for storing a periodic signal and for recycling complete cycle portions of such stored periodic signal is provided, such apparatus comprising:
   (a) means for converting a received periodic signal into a corresponding first train of pulses;
   (b) means for producing a second train of pulses representative of periodic samples of the periodic signal;
   (c) storage means;
   (d) means for coupling the first train of pulses to the storage means for storage therein during a first period of time, such first train of pulses having a repeatable binary pattern;
   (e) means for producing a control signal related to the difference in time coincidence between the first and second train of pulses; and
   (f) means, responsive to the control signal for recycling through the storage means during a second period of time a portion of the first train of pulses having the repeatable binary pattern.

* * * * *